United States Patent [19]

Evans et al.

[11] Patent Number: 4,838,798
[45] Date of Patent: Jun. 13, 1989

[54] HIGH DENSITY BOARD TO BOARD INTERCONNECTION SYSTEM

[75] Inventors: William R. Evans, Mooresville, N.C.; Richard F. Granitz, Harrisburg; George R. Schmedding, Hummelstown, both of Pa.

[73] Assignee: AMP Incorporated, Harrisburg, Pa.

[21] Appl. No.: 207,411

[22] Filed: Jun. 15, 1988

[51] Int. Cl.⁴ .............................................. H01R 9/09
[52] U.S. Cl. ..................................... 439/61; 439/493
[58] Field of Search ...................... 439/61, 64, 65, 74, 439/91, 116, 119, 377, 493, 499, 631, 632, 636, 637, 44

[56] References Cited

U.S. PATENT DOCUMENTS

| | | | |
|---|---|---|---|
| 4,134,631 | 1/1979 | Conrad et al. | 339/17 |
| 4,164,362 | 8/1979 | Cobaugh et al. | 339/17 |
| 4,220,382 | 9/1980 | Ritchie et al. | 439/61 |
| 4,337,499 | 6/1982 | Cronin et al. | 361/386 |
| 4,401,351 | 8/1983 | Record | 339/17 |
| 4,453,309 | 6/1984 | Shirk | 29/884 |
| 4,498,717 | 2/1985 | Reimer | 439/61 |
| 4,511,950 | 4/1985 | Bunner et al. | 361/413 |
| 4,552,420 | 11/1985 | Eigenbrode | 439/92 |
| 4,603,928 | 8/1986 | Evans | 339/17 |
| 4,614,389 | 9/1986 | Albert et al. | 339/45 |
| 4,693,529 | 9/1987 | Stillie | 439/493 |
| 4,708,660 | 11/1987 | Claeys et al. | 439/65 |
| 4,733,461 | 3/1988 | Nakano | 29/830 |

OTHER PUBLICATIONS

Article Entitled "A New Three-Dimensional Packaging Architecture . . . Topology".
Article Entitled "Topological Aspects of Systems Partioning".
Amp Pub P-188-77 Entitled "Intercard Conn. W/O Backplanes".

Primary Examiner—P. Austin Bradley
Attorney, Agent, or Firm—Bruce J. Wolstoncroft

[57] ABSTRACT

A high density interconnection system (2) is configured to provide a reliable interconnection between boards (4, 6). In order to accommodate space restrictions, the circuit boards (4, 6) are placed in a three-dimensional arrangement. The electrical interconnections between boards (4, 6) are provided by electrical connectors (10) rather than by a mother board. The use of electrical connectors (10) enables the signal paths length between the boards to be minimized, thereby allowing for high speed signal transmission.

17 Claims, 3 Drawing Sheets

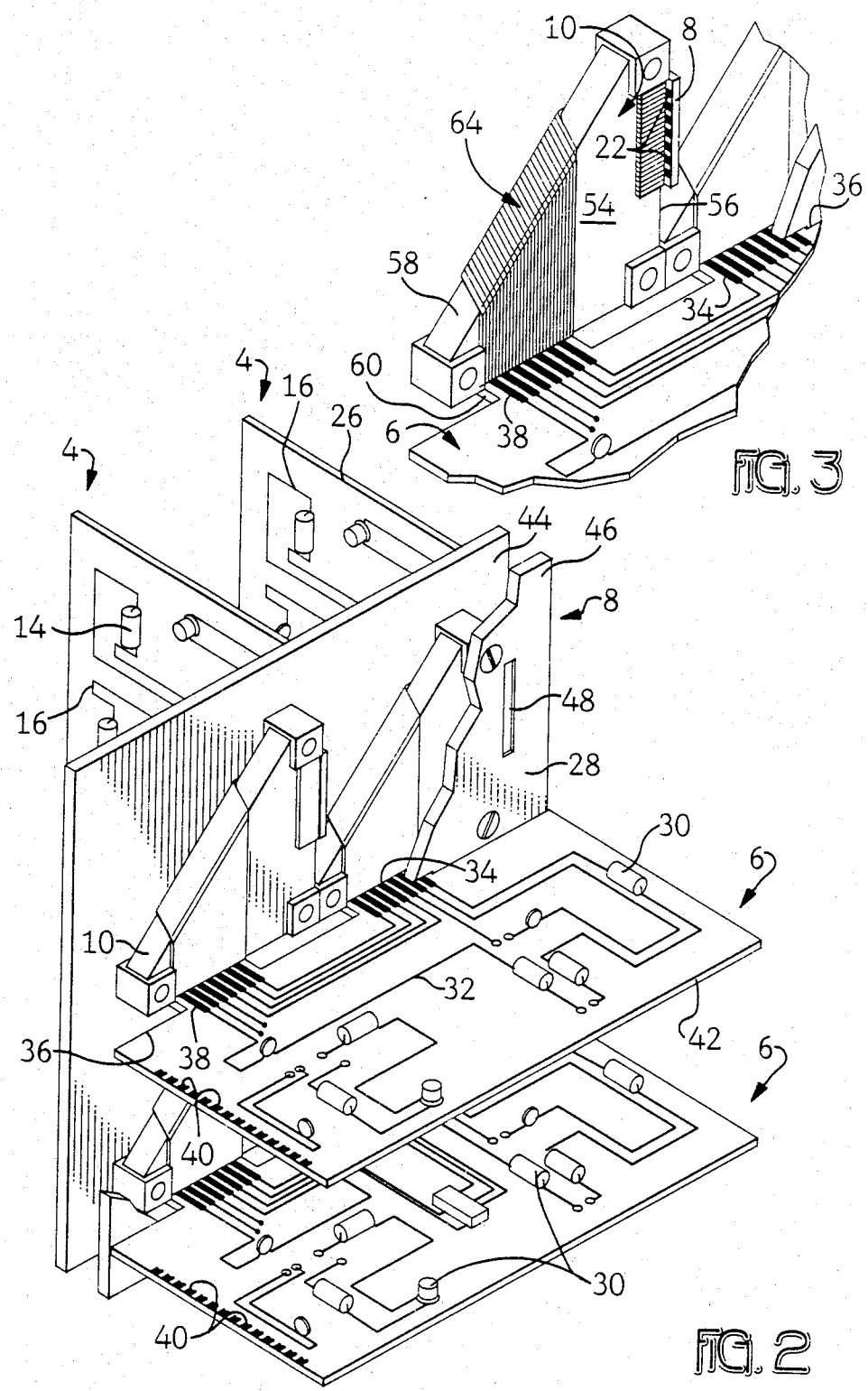

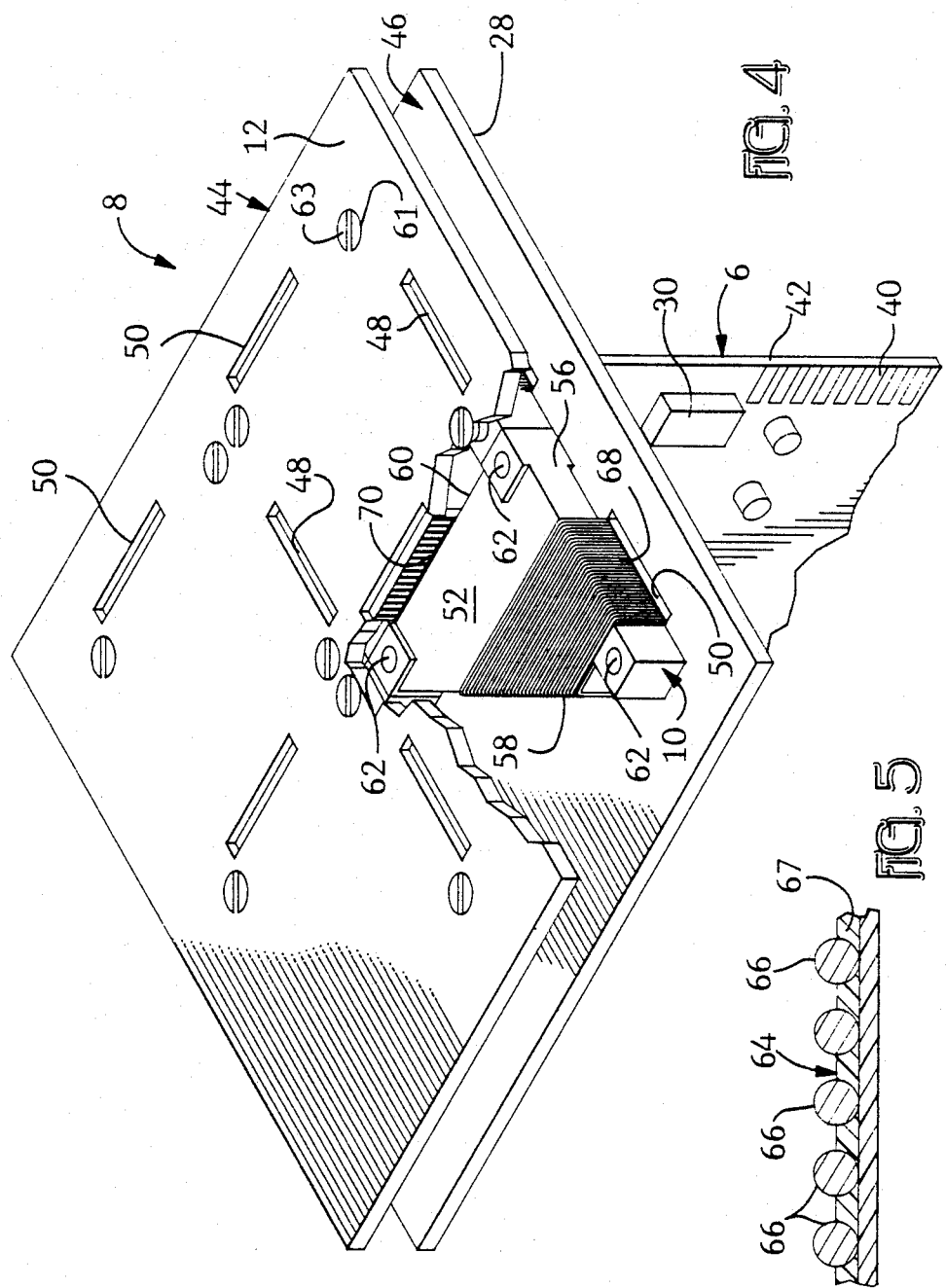

HIGH DENSITY BOARD TO BOARD INTERCONNECTION SYSTEM

FIELD OF THE INVENTION

The invention is directed to an interconnection system which electrically connects circuit boards to each other without the use of a back plane. In particular, the invention is directed to an interconnection system which reduces propagation delay for signal transmission, thereby allowing high speed communication between the respective boards.

BACKGROUND OF THE INVENTION

In this age of electronics, computers are being used with increasing frequency and for much more complex duties than ever before. In order for computers to perform these complex duties, the internal hardware of the computers has also become more complex. This increased complexity of the internal hardware has dramatically increased the need for state of the art equipment design, in which packaging and interconnection are important consideration.

There are numerous interconnection systems which are known and used in the computer industry. An an example of such a system is described in U.S. patent application, Ser. No. 128,000 filed on Dec. 2, 1987. This application discloses a card cage assembly which has a mother board, daughter boards, and baby boards positioned therein. In order for the card cage assembly to operate, the components provided on any given daughter board must be able to communicate with respective components on other daughter boards. This requires that the components of the various daughter boards be electrically connected with each other, so that the signal transmission may cooperate with the respective components. This type of electrical interconnection is provided through the mother board or back plane of the card cage assembly. However the use of a back plane, with its limited space, can increase the length of the electrical pathways over which the signal transmissions must travel. Consequently, respective signal must travel long distances in order for the various components to communicate. This is an unacceptable result in applications in which high speed communication is required between the components of the computer.

Another problem associated with the increased complexity of the internal hardware is the space required for the hardware. Therefore, as the computer industry continues to expand, several attempts have been made to provide a system which utilizes high density packaging. One such packaging scheme was devised by Texas Instruments. This 3-D packaging scheme puts multiple DRAM chips in a small housing in order to achieve high-density memory. Another packaging scheme utilizes molded wiring boards, which allows for 3-D molded circuit boards. However, molding of 3-D circuit boards is a complicated and relatively expensive process.

An alternative packaging scheme is advanced by Bell Communications Research. In this arrangement, the daughter cards are provided in a three-dimensional configuration which utilizes orthogonal edge-to-edge topology. One edge of each vertically positioned first card intersects an edge of every horizontal second card. Thus, the interconnection across the common edge-to-edge midplane (printed circuit card) is simple and short. The midplane also serves to distribute power and ground signal to the daughter cards. However, this configuration has problems associated therewith. First, the use of a midplane can be expensive. Second, delivering the power and ground through the midplane can occupy pins which could be used for signal paths, resulting in the need for more interconnections in order to accommodate the signal path requirements. And third, the configuration of the circuit paths provided in the midplane are dictated by the real estate requirements of the midplane. Consequently, path lengths may be longer than are required.

Therefore, there is a need in the industry to provide a viable, inexpensive system to interconnect printed circuit boards of the computers using minimal space and providing short signal paths in order to minimize the delay time.

SUMMARY OF THE INVENTION

The invention is directed to a high density interconnect system which is used to interconnect various printed circuit boards. In order to accommodate space restrictions, the circuit boards are placed in a three-dimensional configuration. The interconnections between the circuit boards are provided by electrical connectors rather than by printed circuit boards. However, the electrical connectors provide only conductive paths over which signals are transmitted, the power and ground paths are provided to the circuit boards by other means. This type of configuration has several advantages. First, the three dimensional packaging allows the printed circuit boards to be positioned so as to occupy only a minimal space, which is critical in the miniaturized computers used today. Second, the interconnection system used does not require the use of a mother board or backplane, thereby eliminating the cost of a printed circuit board. Third, the configuration of the system allows every printed circuit board in one row to be electrically connected to every printed circuit board in a second row, such the signal path lengths are minimized, thereby decreasing the response time of the computer. And fourth, a minimal amount of electrical connectors are required to interconnect the circuit boards, as all of the conductive paths of the electrical connectors are used for signal transmission.

The invention is directed to an electrical connector for electrically connecting a plurality of first printed circuit boards with a plurality of second printed circuit boards. The electrical connector includes support means having a first major surface and a second major surface. The second major surface is spaced from and extends essentially parallel to the first major surface.

Positioning means positioned are provided on the support means. Respective first positioning means cooperate with respective circuit pads of the first printed circuit boards and respective second positioning means cooperate with respective circuit pads of the second printed circuit boards.

Connector means, having conductor means provided thereon, are mounted to the support means. A first mating end of each connector means is provided proximate a respective first positioning means, and a second mating end of each connector means is provided proximate a respective second positioning means. Upon insertion of a first printed circuit board into a respective first positioning means, the circuit pads of the first printed circuit board are placed in electrical engagement with the conductors at the first mating end of the connector means, and upon insertion of a second printed circuit board into a respective second positioning means, the circuit pads of the second printed circuit board are placed in electrical engagement with the conductors at the second mating end of the connector means. This results in the first printed circuit boards being positioned in electrical engagement with the second printed circuit boards.

BRIEF DESCRIPTION OF THE DRAWINGS

FIG. 2 is a perspective view of the interconnection member rotated ninety degrees from the perspective view of FIG. 1, a portion of the interconnection member has been removed to more fully show the invention.

FIG. 3 is an enlarged fragmentary view of an electrical connector of the present invention.

FIG. 4 is a fragmentary, perspective view of the interconnection member with a portion removed to show the connector provided therein.

FIG. 5 is a cross-sectional view of the conductors provided in an embodiment of the connector.

DETAILED DESCRIPTION OF THE INVENTION

Figure 1:
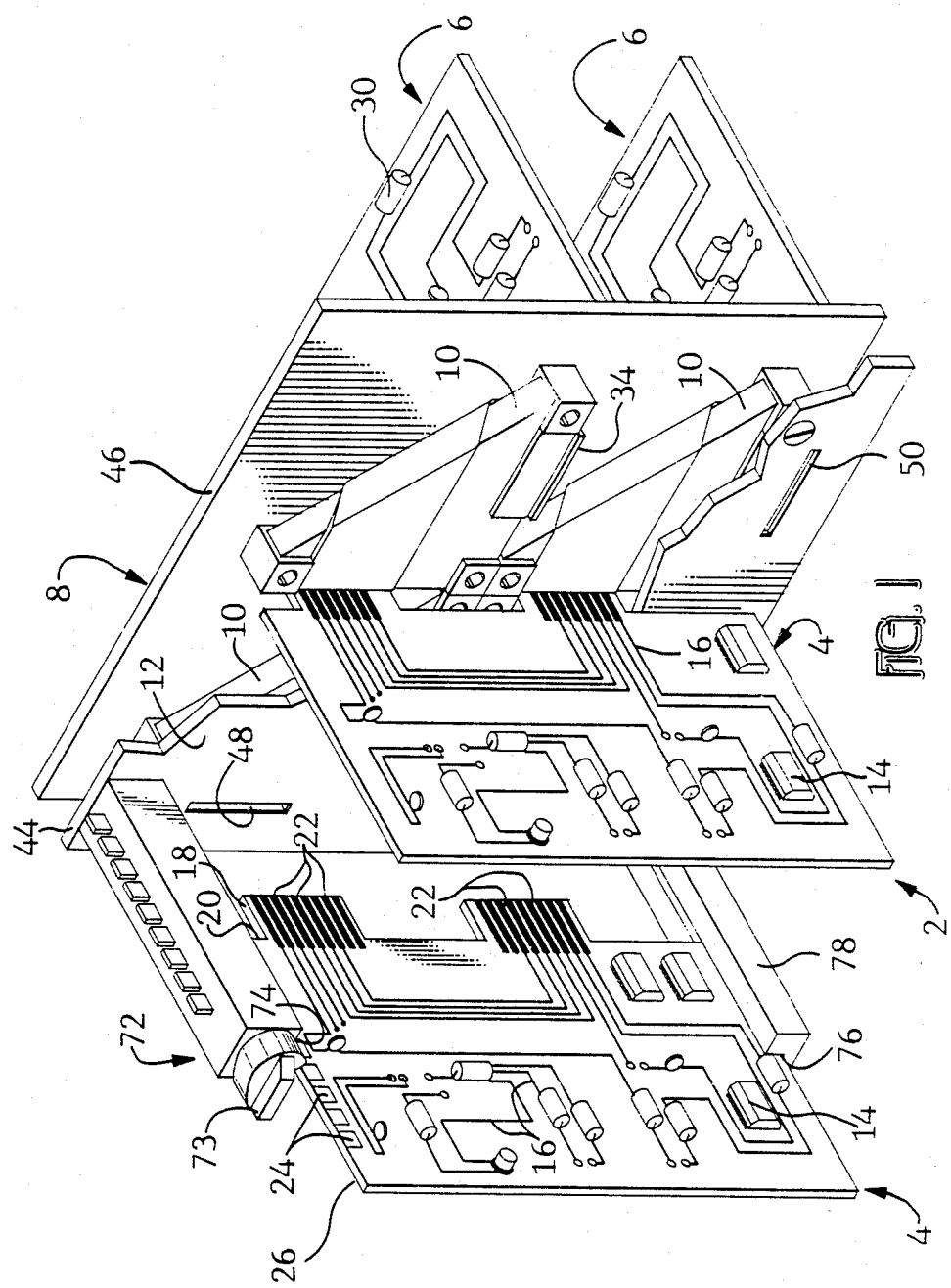
FIG. 1 is a perspective view of an interconnection system of the present invention, showing a portion of an interconnection member removed and a printed circuit board exploded therefrom.

Due to the requirements for increased speed and complexity of computers, it is important to package the internal hardware in such a way as to minimize the space occupied by the hardware, while maximizing the operating capabilities of the hardware. In other words, it is essential to find a cost effective, reliable solution to the problem of providing an interconnection system for the circuit boards of the computer which satisfies the space and performance characteristics required.

As best shown in FIGS. 1 and 2, interconnection system 2 interconnects circuit boards 4 with circuit boards 6. To insure that the interconnection has been effected, interconnection system 2 is provided with an interconnection member 8 which accurately positions circuit boards 4, 6 and provides the electrical connectors 10 required to insure that circuit boards 4 are in electrical engagement with circuit boards 6.

As is shown in FIGS. 1 and 2, two circuit boards 4 are provided. These circuit boards are spaced from each other and extend essentially parallel to one another. The circuit boards 4 are essentially perpendicular to a first major surface 12 (FIG. 1) of interconnection member 8.

As is best shown in FIG. 1, each circuit board 4 has circuitry 14 provided on at least one surface thereof. Conductive paths 16 cooperate with the circuitry 14 to provide the electrical paths required for operation. Conductive paths 16 extend from circuitry 14 to mating areas 18 of circuit board 4. Mating areas 18 extend from a leading edge 20 of circuit board 4. Conductive areas 22 are provided on the mating areas 18, the conductive areas 22 being in electrical engagement with respective conductive paths 16 of the circuit board 4.

Several respective conductive paths 16 are provided in electrical engagement with conductive pads 24 which are located on the side edges 26 of each circuit board 4. These conductive pads 24 are provided to supply the power and ground signals required for the operation of circuit boards 4.

It should be noted that although two circuit boards 4 are shown in the figures, any number of circuit boards 4 can be provided.

As is shown in FIG. 2, two circuit boards 6 are provided. These circuit boards are spaced from each other and extend essentially parallel to one another. The circuit boards 6 are essentially perpendicular to a second major surface 28 of interconnection member 8. Circuit boards 6 are also essentially perpendicular to circuit boards 4.

As is best shown in Figure 1, each circuit board 6 has circuitry 30 provided on at least one surface thereof. Conductive paths 32 cooperate with the circuitry 30 to provide the electrical paths required for operation. Conductive paths 32 extend from circuitry 30 to mating areas 34 of circuit board 6. Mating areas 34 extend from a leading edge 36 of circuit board 6. Conductive areas 38 are provided on the mating areas 34, and are in electrical engagement with respective conductive paths 32 of the circuit board 6.

Several respective conductive paths 32 are provided in electrical engagement with conductive pads 40 which are located on the side edges 42 of each circuit board 6. These conductive pads 40 are provided to supply the power and ground signals required for the operation of circuit boards 6.

It should be noted that although two circuit boards 6 are shown in the figures, any number of circuit boards 6 can be provided.

As shown in FIGS. 1 and 2, circuit boards 4 and 6 are maintained in electrical engagement by means interconnection member 8. Interconnection member 8, as shown in FIG. 4, has a first planar member 44 and a second planar member 46. First planar member 44 is spaced from and extends essentially parallel to second planar member 46. First major surface 12 of interconnection member 8 is provided on first planar member 44, and second major surface 28 is provided on second planar member 46.

Openings 48, 50 are provided on, and extend through first and second planar members 44, 46. As is best shown in FIG. 1, openings 48 are essentially perpendicular to openings 50, such that mating areas 18 of circuit boards 4 cooperate with openings 48 and mating areas 34 of circuit boards 6 cooperate with openings 50, as will be discussed. It should be noted that openings 48 of first planar member 44 are provided in alignment with respective openings 48 of second planar member 46. Similarly, openings 50 of first planar member 44 are positioned in alignment with openings 50 of second planar member 46.

As is shown in FIGS. 3 and 4, electrical connectors 10 are positioned between first planar member 44 and second planar member 46. Electrical connector 10 is essentially triangular in configuration and has a first major surface 52, a second major surface 54, and side surfaces 56, 58, 60 extending therebetween. Mounting holes 62 are provided proximate the corners of electrical connector 10, the mounting holes 62 extend from first major surface 52 to second major surface 54. The electrical connectors 10 are maintained in position with respect to first and second planar members 44, 46 by screws 63 or other securing means which cooperate with mounting holes 62. Screws extend through openings 61 of planar members 44, 46 and holes 62 to not only maintain connectors 10 in position, but to also maintain planar members 44, 46 is position with respect to each other.

A flexible cable 64 is provided to cooperate with the electrical connector 10. One example of the type of cable 64 which can be used is described in U.S. Pat. No. 4,453,309, which is hereby incorporate by reference. As shown in FIG. 5, with this type of configuration, individual conductors 66 are partially encased in an adhesive material 67, such that the conductors 66 are maintained in a spaced apart fashion. A portion of each conductor is exposed, as shown in FIG. 5. The adhesive material 67 mechanically locks conductors 66 therein, while providing the nonrigid characteristics required to allow the cable 64 to be formed into any shape desired. Conductors 66 can be selected of a material with resilient spring properties, such that as the cable is formed, resilient spring energy is stored and utilized to apply pressure at the points of contact between conductors 66 and conductive areas 22, 38, as will be discussed.

As is shown in FIG. 5, the flexible cable 64 is bent around the electrical connector 10. A first end 68 of the cable is positioned proximate side surface 56. The cable is then bent such that cable 64 extends along first major surface 52, around side surface 58, and along second major surface 54. A second end 70 of the cable is positioned proximate side surface 60. The cable is bent around electrical connector 10 in such a manner so that the portions of the wires which are encased by the adhesive material 67 are provided proximate the electrical connector 10, and the exposed portions of the conductors 66 are provided away from the electrical connector 10. This allows for the conductors to electrically engage boards 4, 6 when boards 4, 6 are provided in openings 48, 50, as will be discussed.

Power is supplied to boards 4, 6 by way of power zero insertion force (ZIF) connector 72. The operation of these power ZIF connectors is essentailly similar to that described in copending U.S. patent application Ser. No. 127,747, filed Dec. 2, 1987, which is hereby incorporated by reference. The use of power ZIF connector 72 simplifies interconnection member 8. As power is supplied through the side edges of boards 4, 6 rather than by way of mating areas 18, 34, the conductive areas 22, 38 provided on the mating areas can all be used for signal transmission. Consequently, as interconnection member 8 is only used for signal transmission, the number of conductors 66 which are required for operation is minimized. This allows interconnection member 8 to be smaller, and allows the length of the conductors to be minimized, as the circuitry of the interconnection member is simplified.

In operation, circuit boards 4 are placed in electrical connection with circuit boards 6 by means of interconnection member 8. Circuit boards 4 are inserted into channels 74 of connectors 72 and channels 76 of tracks 78. Once boards 4 are positioned in alignment with channels 74, 76, boards 4 are moved toward interconnection member 8. This movement continues until mating areas 18 cooperate with openings 48, and leading surface 20 engages first major surface 12. The alignment of mating areas 18 and openings 48 is insured due to the cooperation of channels 74, 76. In other words, channels 74, 76 are provided in alignment with openings 48 and act as a guide which insures that the mating areas 18 are aligned with openings 48.

As mating areas 18 are inserted into openings 48, conductive areas 22 are placed in engagement with the exposed conductors 66 of cable 64. This engagement provides an electrical path across which the signal transmissions can travel. It should be noted, that due to the dense side-by-side spacing of conductors 66, multiple conductors 66 may engage a single conductive area 22, thereby providing for redundant, independent electrical connections. The resilient characteristics of conductors 66 insures that an electrical connection is insured between the conductors 66 and conductive areas 22 by providing a wiping action between conductive areas 22 and conductors 66 as boards 4 are inserted into openings 48. The resilient nature of conductors 66 also provides the characteristics required to allow for many cycles (insertions and removals) of the board without effecting the electrical characteristics thereof.

When boards 4 are fully inserted into interconnection member 8, conductive pads 40 are placed in alignment with terminals (not shown) of power connector 72. An actuator 73 is then engaged, causing the terminals to cooperate with the conductive pads 40 of board 4. This cooperation provides the electrical path required for current to flow from the terminals to boards 4. Also, the cooperation of the terminals with board 4 provides the means to maintain circuit board 4 is its inserted position.

Essentially the same insertion process is duplicated as boards 6 are inserted into openings 50. This provides the electrical characteristics required to insure that a positive electrical connection is provided between boards 4 and boards 6, by way of connectors 10.

It is important to note, that as the insertion of mating areas 18, 34 of boards 4, 6 are inserted into openings 48, 50 of interconnection member 8, the exposed portions of wires 66 which are provided at the ends 68, 70 of flexible cable 64 wipingly engage conductive areas 22, 38 of mating areas 18, 34 of boards 4, 6. This wiping is insured because of the resilient nature of conductors 66. Consequently, as mating areas 18, 34 are inserted into openings 48, 50, a positive electrical connection between conductive areas 22, 38 and conductors 66 is insured.

Interconnection system 2 is configured to insure for the reliable interconnection between circuit boards, in such a manner as to minimize the space required for such an interconnection, as well as minimizing the cost associated therewith. This type of configuration has several benefits associated therewith.

Interconnection system 2 described above does not require the use of a mother board or backplane to interconnect the circuit boards 4, 6. This lowers the cost of the system, as the extra cost of a complex mother board is not required for operation.

The use of individual connectors rather than a mother board also simplifies the signal paths required between circuit boards 4 and circuit boards 6. The signal paths, which are provided by the connectors and extend between respective circuit boards 4 and circuit boards 6, are short and direct. There is no need to extend the signal path in order to avoid other circuitry, as would be true in the case of a mother board. Consequently, the signal paths provided in interconnection system 2 are beneficial in all instances, but particularly when high speed applications are required.

The use of individual connectors also reduces the repair cost and minimized the down time of the circuitry. If the interconnection between any respective boards 4, 6 should fail, the individual connector which is deficient can be removed and replaced. This is a quick and easy operation. If a mother board is used, the entire mother board would have to be replace. This is a costly and time consuming option, which in many instances is unacceptable.

Changes in construction will occur to those skilled in the art and various apparently different modifications and embodiments may be made without departing from the scope of the invention. The matter set forth in the foregoing description and accompanying drawings is offered by way of illustration only. It is therefore intended that the foregoing description be regarded as illustrative rather than limiting.

We claim:

1. An electrical connector for electrically connecting a plurality of first circuit boards having first conductive regions provided thereon with a plurality of second circuit boards having second conductive regions provided thereon, the electrical connector comprising:

support means having a first planar member with a first major surface provided thereon, and a second planar member spaced from and parallel to the first planar member, the second planar member having a second major surface provided thereon;

positioning means positioned on the support means, first positioning means cooperate with the first conductive regions of the first printed circuit boards and second positioning means cooperate with the second conductive regions of the second printed circuit boards;

connector means mounted to the support means, the connector means having conductors provided thereon, a first mating end of each connector means is provided proximate a respective first positioning means, and a second mating end of each connector means is provided proximate a respective second positioning means, the connector means is positioned between the first planar member and the second planar member, the planar member having securing means which cooperates with the connector means to maintain the spacing of the planar members and to maintain the connector means therebetween;

whereby upon insertion of a first circuit board into a respective first positioning means, the first conductive regions of the first circuit board are placed in electrical engagement with the conductors at the first mating end of the connector means, and upon insertion of a second circuit board into a respective second positioning means, the second conductive regions of the second circuit board are placed in electrical engagement with the conductors at the second mating end of the connector means, thereby placing the first circuit boards in electrical engagement with the second circuit boards.

2. An electrical connector as recited in claim 1, the connector means comprising:

a connector housing having conductor receiving surfaces, the first mating end, and the second mating end provided thereon, the second mating end positioned essentially perpendicular to first mating end;

the conductors are positioned on the conductor receiving surfaces, ends of conductors are provided proximate the first and the second mating ends of the connector housing, portions of the ends of the conductors are exposed;

whereby as the conductive regions of the circuit boards are inserted into the positioning means, the exposed ends of the conductors are placed in electrical engagement with the conductive regions, thereby placing the first conductive regions of a respective first circuit board in electrical engagement with the second conductive regions of a respective second circuit board.

3. An electrical connector as recited in claim 1 wherein the conductors are provided in a flat flexible cable.

4. An electrical connector as recited in claim 1 wherein the positioning means are openings provided in the first and the second planar members, the openings being dimensioned such that upon the insertion of the respective first and second conductive regions therein, the openings will cooperate with the circuit pads to maintain the conductive regions therein.

5. An electrical connector as recited in claim 4 wherein guide tracks extend from the first and the second planar members is a direction which is essentially perpendicular thereto, the guide tracks cooperate with side edges of the circuit boards to guide the circuit boards as the circuit boards are inserted into the positioning means, thereby insuring that the conductive regions of the circuit boards will be properly inserted into the positioning means of the support means.

6. An electrical connector as recited in claim 5 wherein the guide tracks are placed in electrical connection with conductive regions on the circuit boards, such that upon insertion of the circuit boards, the guide tracks provide the power and ground paths required for operation of the circuit boards.

7. A system for interconnecting circuit boards, the system comprising:

a plurality of first circuit boards, the first circuit boards being spaced from each other and extending essentially parallel to each other;

a plurality of second circuit boards, the second circuit boards being spaced from each other and extend essentially parallel to each other, the second circuit boards and the first circuit boards are configured in an orthogonal array;

a plurality of conductive zones provided on the first and the second circuit boards;

a plurality of connector means provided proximate the conductive zone of the circuit boards, the connector means having conductors provided thereon, each respective conductor means is in electrical engagement with a respective conductive zone of a second circuit board, such that an electrical path is provided over which signals of the respective first circuit board and second circuit board can travel;

the conductors are provided in a flat flexible cable;

whereby the connector means provides the electrical path required to insure that every first circuit board is in electrical engagement with every second circuit board.

8. A system for interconnecting circuit boards as recited in claim 7, including:

support means having a first major surface and a second major surface spaced from and essentially parallel to the first major surface.

9. A system for interconnecting circuit boards as recited in claim 8, including:

positioning means positioned on the support means, first respective positioning means cooperate with respective conductive zones of the first circuit boards and second respective positioning means cooperate with respective conductive zones of the second circuit boards.

10. A system for interconnecting circuit boards as recited in claim 9, the support means comprising:

a first planar member having the first major surface provided thereon;

a second planar member spaced from and parallel to the first planar member, the second planar member having the second major surface provided thereon.

11. A system for interconnecting circuit boards as recited in claim 10 wherein the connector means is positioned between the first planar member and the second planar member, the planar members having securing means which cooperates with the connector means to maintain the spacing of the planar members and to maintain the connector means therebetween.

12. A system for interconnecting circuit boards as recited in claims 11, the connector means comprising:

a connector housing having conductor receiving surfaces, a first mating end, and a second mating end provided thereon, the second mating end positioned essentially perpendicular to first mating end;

the conductors means are positioned on the conductor receiving surfaces, ends of conductor means are provided proximate the first and the second mating ends of the connector housing, portions of the ends of the conductor means are exposed;

whereby as the conductive zones of the circuit boards are inserted into the positioning means, the exposed ends of the conductor means are placed in electrical engagement with the conductive zones, thereby placing the conductive zones of a respective first circuit board in electrical engagement with the conductive zones of a respective second circuit board.

13. An interconnection member for connecting plurality of first circuit boards with a plurality of second circuit boards, the interconnection member comprising:

connector means having a first end surface and a second end surface, the first end surface being essentially perpendicular to the second end surface, conductor means provided to cooperate with the connector means, the conductor means extend from the first end surface to the second end surface;

support means provided proximate the connector means, the support means being secured to the connector means to maintain the spacing of the connector means, openings are provided in the support means, the openings extend from a first major surface of the support means to a second major surface of the support means, the openings being positioned such that when the connector means are secured to the support means, the first ends and the second ends of the connector means are provided proximate the openings;

whereby as first and second circuit boards are inserted into respective openings, the openings act as guides to insure that the circuit boards are positioned proximate respective ends of respective connector means and in electrical engagement with the respective conductor means, such that the first circuit boards are placed in electrical communication with the second circuit boards.

14. An interconnection member as recited in claim 13, the support means comprising:

a first planar member having the first major surface provided thereon;

a second planar member spaced from and parallel to the first planar member, the second planar member having the second major surface provided thereon.

15. An interconnection member as recited in claim 14 wherein guide tracks extend from the first and the second planar members is a direction which is essentially perpendicular thereon, the guide tracks cooperate with side edges of the circuit boards to guide the circuit boards as the circuit boards are inserted into the positioning means, thereby insuring that the circuit boards will be properly inserted into the openings of the support means.

16. An interconnection member as recited in claim 15 wherein the guide tracks are placed in electrical connection with conductive areas on the circuit boards, such that upon insertion of the circuit boards, the guide tracks provide the power and ground paths required for operation of the circuit boards.

17. An interconnection member as recited in claim 16 wherein the conductor means have ends with exposed conductors thereon which are positioned proximate the first end surface and the second end surface, whereby as the circuit boards are inserted into the openings of the securing means, the exposed ends of the conductor means are placed in electrical engagement with the circuit boards, thereby placing the first circuit boards in electrical engagement with second circuit boards.

* * * * *